United States Patent [19]

Wurst

[11] Patent Number: 5,281,920
[45] Date of Patent: Jan. 25, 1994

[54] ON-LINE BATTERY IMPEDANCE MEASUREMENT

[75] Inventor: John W. Wurst, Chester Township, Morris County, N.J.

[73] Assignee: Btech, Inc., Whippany, N.J.

[21] Appl. No.: 934,102

[22] Filed: Aug. 21, 1992

[51] Int. Cl.⁵ .................... G01N 27/02; H02J 07/04
[52] U.S. Cl. .................... 324/430; 324/434; 320/48; 340/636
[58] Field of Search ............ 324/430, 434, 429, 433; 340/636; 320/48

[56] References Cited

U.S. PATENT DOCUMENTS

| | | | |
|---|---|---|---|
| 3,487,295 | 12/1969 | Nocera et al. | 324/434 |
| 3,586,962 | 6/1971 | Robstock | 324/429 |
| 3,599,094 | 8/1971 | Pring | 324/429 |
| 4,053,824 | 10/1977 | Dupuis et al. | 324/29.5 |
| 4,134,060 | 1/1979 | Feldman | 324/434 |
| 4,238,721 | 12/1980 | DeLuca et al. | 320/18 |
| 4,274,043 | 6/1981 | Heitz | 320/6 |
| 4,316,185 | 2/1982 | Watrous et al. | 324/433 X |
| 4,352,067 | 9/1982 | Ottone | 324/429 |
| 4,484,130 | 11/1984 | Lowndes et al. | 320/40 |
| 4,513,167 | 4/1985 | Brandstetter | 136/244 |
| 4,590,430 | 5/1986 | Vandenberghe | 324/434 |
| 4,616,170 | 10/1986 | Urstoger | 320/5 |
| 4,694,237 | 9/1987 | Hanson | 320/6 |
| 4,697,134 | 9/1987 | Burkum et al. | 324/430 |
| 4,707,795 | 11/1987 | Alber et al. | 324/433 X |
| 4,931,738 | 6/1990 | MacIntyre et al. | 324/434 |
| 4,947,124 | 8/1990 | Hauser | 324/430 |
| 5,047,722 | 9/1991 | Wurst et al. | 324/430 |
| 5,047,961 | 9/1991 | Simonsen | 364/550 |

FOREIGN PATENT DOCUMENTS 2243695 11/1991 United Kingdom ............ 324/434

Primary Examiner—Kenneth A. Wieder
Assistant Examiner—Christopher Tobin
Attorney, Agent, or Firm—David L. Davis

[57] ABSTRACT

Impedance measurement of battery cells within a battery system comprising at least one string of battery cells is accomplished by dividing each of the strings into at least two portions. A loading current for measurement purposes is only imposed on a portion of one of the strings at any given time and battery cell voltage measurements are made only within this string portion.

8 Claims, 3 Drawing Sheets

ON-LINE BATTERY IMPEDANCE MEASUREMENT

BACKGROUND OF THE INVENTION

This invention relates to battery backup systems having a large number of battery cells and, more particularly, to the measurement of battery cell impedance while the batteries remain on-line.

Large battery systems are commonly used to provide backup power in case there is a failure of the commercial power grid. Typically, such a backup system includes a single string or a plurality of parallel strings of serially connected rechargeable battery cells and a charger connected to the commercial power grid for maintaining the charge on the battery cells. An inverter is coupled between the strings of battery cells and the load, which inverter is enabled upon the detection of a failure of the power grid. In some applications, the inverter may be continuously operational to power the load with energy from the charger during the time that commercial power is available. Many of these battery backup systems, called "uninterruptable power supplies", are configured such that the load is never aware of any failure of the power grid because the battery system immediately supplies the necessary energy upon failure of the power grid.

A typical installation of such an uninterruptable power supply is between the power grid and a large computer system used by financial, communications, manufacturing and other commercial industries. If the battery system is taken "off-line" for any reason, the necessary protection against power outages is lost for the time that the battery system is not connected plus the time for recharging, if a significant amount of charge has been removed during the off-line period of time. However, such battery backup systems must be monitored on a regular basis to insure that protection from power grid failure is always available.

Impedance measurement is a method by which the condition of a battery may be assessed without taking the battery off-line. Impedance measurements typically impose a current (hereinafter called the "loading current") on the part to be evaluated and measure the resultant voltage. Various commercially available test instruments function this way. Using Kelvin connections, these instruments impose a current on just the component to be measured. After a measurement has been made, the operator moves the Kelvin clips to the next component, reads the value, moves the clips again, and continues in this manner until all the components have been measured. Therefore, the loading current flows almost entirely through the component being measured, the parallel paths (if they exist) generally being of so much higher impedance that any loading current flowing through them is of little or no consequence.

U.S. Pat. No. 5,047,722 discloses a system for measuring the impedance of a battery cell within a string of battery cells. The disclosed system draws a pulsed, measured or controlled loading current from the entire string and, while doing so, measures the voltage across each of the cells or groups of cells which make up the battery string. However, if the output impedance of the charger is extremely low compared to the impedance of the battery at the measurement frequency, or if the battery is composed of multiple parallel strings, then only some part of the loading current being drawn to make the measurement will be flowing through the cell or interconnection being tested. If this is the case, the calculated impedance may be less than the true value. In the extreme case, generally when the impedance of the charger is very low (the practice of placing a large capacitance across the charger output terminals to protect the battery from ripple currents is becoming increasingly prevalent with uninterruptable power supply manufacturers), such a small percentage of the loading current comes from the battery that impedance measurement is virtually impossible. Of course, when a low output impedance charger is used, the charger is the dominant shunt impedance, so that the presence of any number of parallel strings of cells is of no consequence.

It is therefore an object of the present invention to be able to measure battery cell impedance in a battery backup system of the type described which obviates all of the described problems which result from low charger impedance and the existence of multiple parallel strings.

SUMMARY OF THE INVENTION

The foregoing, and additional, objects are attained in accordance with the principles of this invention for measuring battery cell impedances in a system having at least one string of battery cells by only imposing the loading current on a portion of one of the strings at any given time. Battery cell voltage measurements are made only within this string portion. Then, the loading current connections are moved to another string portion and voltage measurements are performed within that string portion. This process is continued until all of the battery cells within the battery backup system have been examined.

BRIEF DESCRIPTION OF THE DRAWINGS

The foregoing will be more readily apparent upon reading the following description in conjunction with the drawings in which like elements in different figures thereof are identified by the same reference numeral and wherein.

DETAILED DESCRIPTION

Figure 1:
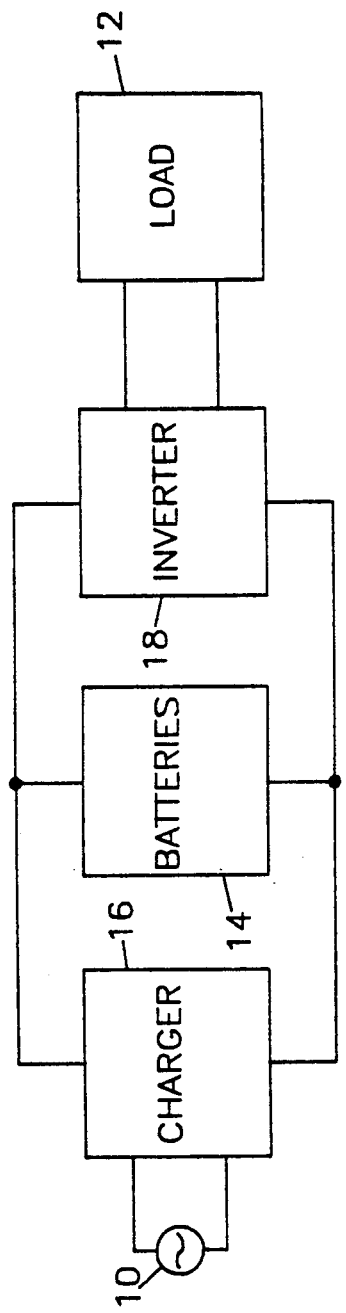
FIG. 1 is an overall block diagram of a prior art battery backup system in which the present invention finds utility.

Referring now to the drawings, FIG. 1 illustrates a typical prior art battery backup system coupled to the commercial power grid 10. The backup system is adapted to provide power to the load 12 upon detection of failure of the power grid 10. What is not shown in FIG. 1 is the direct connection of the load 12 to the power grid 10 and the arrangement which disconnects the load 12 from the power grid 10 upon detection of the power grid failure, such arrangement being conventional and well known in the art.

The battery backup system shown in FIG. 1 includes a bank of batteries 14 connected to a charger 16 and an inverter 18. The battery bank 14 typically comprises at least one string of serially connected rechargeable battery cells. The charger 16 maintains the battery cells within the battery bank 14 at their full level of charge when the power grid 10 is operational, as is well known. Upon detection of a failure of the power grid 10, the inverter 18 becomes operative to transform energy from the battery bank 14 into the same form normally provided by the power grid 10 and supply such transformed energy to the load 12, so that the load 12 does not see any interruption of power. Typically, the power grid 10 provides alternating current so that the inverter 18 functions to convert the direct current provided by the battery bank 14 into alternating current. The foregoing is conventional and well known in the art and will not be described in any further detail.

Figure 2:
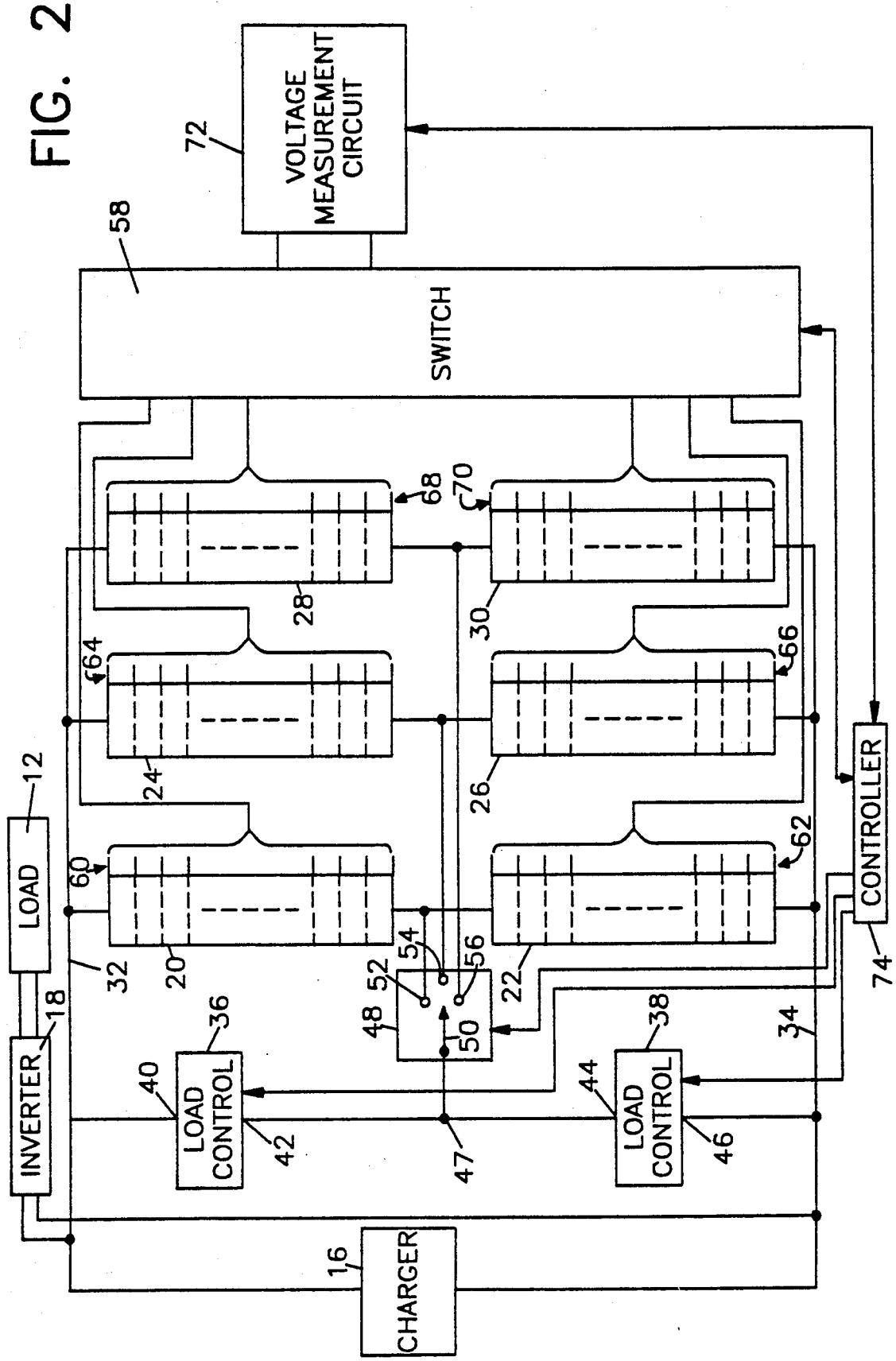
FIG. 2 is a block diagram showing impedance measuring connections to the system of FIG. 1 according to this invention.

Referring now to FIG. 2, for the purposes of explaining the present invention, the battery bank 14 will be described as comprising three parallel strings of one hundred cells each. According to an embodiment of this invention, each of the strings is divided into two portions of fifty cells each. Thus, as shown in FIG. 2, the first string comprises the portions 20 and 22; the second string comprises the portions 24 and 26; and the third string comprises the portions 28 and 30. The strings 20, 22; 24, 26; and 28, 30 are connected in parallel between a first rail 32 and a second rail 34. According to this invention, there are also provided two load control circuits 36 and 38. Preferably, the load control circuits 36, 38 are of the type disclosed in U.S. Pat. No. 5,047,722, the contents of which are hereby incorporated by reference. The load control circuits 36, 38 act as on/off switches and, when on, as current regulators. The load control circuit 36 has its first terminal 40 connected to the first rail 32 and its second terminal 42 connected to the first terminal 44 of the load control circuit 38. The second terminal 46 of the load control circuit 38 is connected to the second rail 34. The junction 47 of the second terminal 42 of the load control circuit 36 and the first terminal 44 of the load control circuit 38 is connected to a first switch 48. For purposes of illustration, the first switch 48 is shown as a single pole triple throw switch. The junction 47 is connected to the armature 50 of the switch 48. The switch 48 is for the purpose of selectively connecting the load control circuits 36, 38 to intermediate points in the battery strings. Thus, the terminal 52 of the switch 48 is connected to the intermediate point between the portions 20 and 22 of the first string; the terminal 54 of the switch 48 is connected to the intermediate point between the portions 24 and 26 of the second string; and the terminal 56 of the switch 48 is connected to the intermediate point between the portions 28 and 30 of the third string. Illustratively, these intermediate points are the midpoints of the respective strings.

According to this invention, connections are also provided across groups of the battery cells within the strings. Preferably, these connections are provided across each individual battery cell. Typically, the battery cells making up the strings are rechargeable wet cells having exposed terminals at their anodes and cathodes. These battery cell connections are all coupled to the second switch 58. Thus, the connections 60 of the first portion 20 of the first string, the connections 62 of the second portion 22 of the first string, the connections 64 of the first portion 24 of the second string, the connections 66 of the second portion 26 of the second string, the connections 68 of the first portion 28 of the third string, and the connections 70 of the second portion 30 of the third string are all coupled to the switch 58. The switch 58 is also coupled to the voltage measurement circuit 72, which is preferably an AC voltmeter, as disclosed in the aforereferenced patent.

The system shown in FIG. 2 is under the control of the controller 74, which may be an appropriately programmed computer. The controller 74 is coupled to the load control circuits 36 and 38, the first switch 48, the second switch 58, and the voltage measurement circuit 72. Controller 74 is operative to control the switch 48 to select one of the three parallel strings and then to make operative one of the load control circuits 36 and 38. At any given time, only one of the load control circuits 36 and 38 is operative. Thus, at any given time, only one of the string portions 20, 22, 24, 26, 28 and 30 is connected to an operative one of the load control circuits 36 and 38. The controller 74 controls the switch 58 to connect in succession each of the cells within that string portion to the voltage measurement circuit 72, which communicates with the controller 74 and transmits its measurements thereto for analysis.

Figure 3:
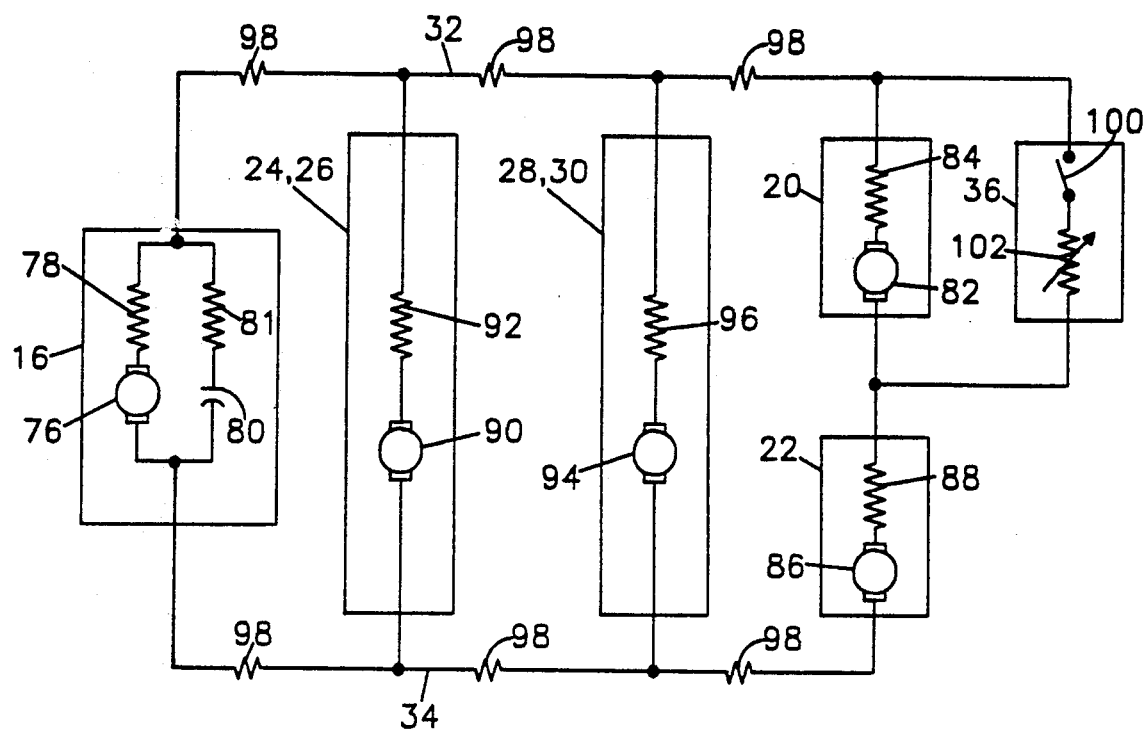
FIG. 3 shows typical simplified equivalent circuits for the block diagram of FIG. 2 which may be used for sample calculations.

FIG. 3 shows typical simplified equivalent circuits for the system shown in FIG. 2, and which will be used hereinafter for sample calculations. Thus, the charger 16, in a typical installation, may be considered to comprise the 225 volt generator 76 in series with the output resistor 78, both of which are in parallel with the output capacitor 80 and its effective series resistance 81. Typically, the capacitor 80 is very large so that it has a low value of capacitive reactance to minimize ripple currents put out by the charger 16 or demanded by the inverter 18 (not shown in FIG. 3). Because the capacitor 80 is very large to perform its intended function, and because it is reactive, it is the resistance in the strings themselves which is the major determinant of current division under test load conditions, as will be described in full detail hereinafter.

The portion 20 of the first battery string may be considered to comprise the 112.5 volt generator 82 in series with the fifty milliohm resistor 84. This is a typical resistance value for a properly functioning battery string. Likewise, the string portion 22 comprises similar generator 86 and similar resistor 88. The string portions 24 and 26 are shown as a unitary string with 225 volt generator 90 and one hundred milliohm resistor 92. Likewise, the string portions 28 and 30 are shown as a unitary string with 225 volt generator 94 and one hundred milliohm resistor 96. The rails 32 and 34 are shown as having small amounts of distributed resistance 98, but since in a well designed installation this distributed resistance is small compared to the resistance in the battery strings, the distributed resistance 98 will be ignored in the following discussion.

The load control circuit 36 is illustrated as comprising the switch 100 in series with the variable resistor 102. The resistor 102 is shown as being variable because its value determines the loading current which is allowed to flow through the load control circuit 36 during the impedance measurement time period.

Figure 4:
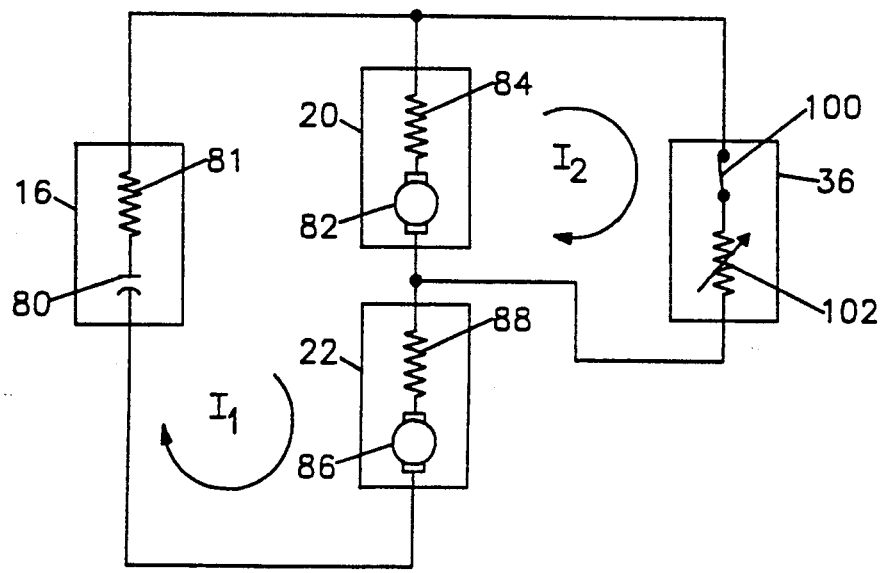
FIG. 4 shows typical current paths when a string portion of the battery system is loaded in accordance with this invention.

As previously discussed, one of the problems solved by the present invention is insuring that sufficient current is available for impedance measurement purposes even if the charger 16 has a low output impedance. FIG. 4 shows typical current paths when the string portion 20 is loaded so that measurements of the battery cells within the string portion 20 may be taken. In FIG. 4, the charger 16 is represented by the capacitor So in series with its effective series resistance 81. The generator 76 of the charger 16 is not shown in FIG. 4 because, as discussed above, the voltage measurement circuit 72 (FIG. 2) is an AC voltmeter and the voltage on the capacitor 80 may be utilized for the purposes of the following discussion. Also, the parallel strings 24, 26 and 28, 30 are not shown in FIG. 4 because their impedance is typically much greater than the impedance of the charger 16, so their effect on current flow calculations is negligible. Therefore, only string portion 20 in parallel with the load control circuit 36 and string portion 22 are shown, in addition to charger 16.

Calculations demonstrate that when string portion 20 is loaded by the load control circuit 36, the direction of current flow is such as to discharge the battery cells within the string portion 20 but to charge the battery cells within string portion 22. Since the magnitude of the current $I_2$ can be controlled by the load control circuit 36, the relative proportions of the currents $I_1$ and $I_2$ determine the resultant current flowing through string portion 20 where the impedances of the battery cells are to be determined. In order to measure the impedance of a battery cell, there must be a known or significant current of measurable amplitude flowing through the cell. If conditions vary so much that an adequate current flow through the battery string cannot be obtained, then impedance measurement may be impossible. On the other hand, according to the present invention, one can be assured that at least a minimum current for measurement purposes flows through the string portion 20.

Keeping the foregoing in mind, the minimum proportion of the loading current to flow through the string portion 20 will occur when the current $I_1$ is maximum, which occurs when the value of the resistance of the charger 16 is zero. This resistance is the parallel combination of the resistors 78 (not shown in FIG. 4) and 81. Current flow calculations demonstrate that, for this condition, the current flowing through the string portion 20 (i.e., $I_2 - I_1$) is exactly one half of the loading current $I_2$. Assuming for the moment that the load control circuit 36 regulates the current $I_2$ to be 20 amps, then:

$$I_1 = (225 - 112.5 - 112.5 + I_2 \times 0.050)/(0.050 + 0.050 + 0) = 10 \text{ amps.}$$

If there is only one battery string in the system and the output impedance of the charger 16 is high compared to the impedance of the battery string, then essentially all of the loading current will flow through the string. The general case may then be stated to be that the maximum possible loading current for measurement purposes will be the current imposed by the measuring device and the minimum possible measurement current will be the same percentage of the total loading current as one minus the fractional part of the string across which the loading current is imposed.

In a more typical case where the value of the resistance of the charger 16 is 0.02 ohms then:

$$I_1 = (0.05 I_2)/(0.12) = 8.33 \text{ amps.}$$

The current through the string portion 20 would then be:

$$I_2 - I_1 = 20 - 8.33 = 11.67 \text{ amps.}$$

In summary, if the loading current $I_2$ is drawn from a full string which is being supplied by a charger whose output impedance is essentially zero, then essentially none of the loading current will come from the battery but instead will be provided by the charger, thereby preventing the measurement of battery string impedance. However, if the string is divided in half, then only half the current will come from a charger with essentially zero impedance.

The practical application of this concept is as follows. The output impedance of the charger is generally unknown to the manufacturer of the test equipment and, for any specific charger, may vary from significantly more to significantly less than the battery's impedance. The battery's configuration and cell type may be unknown or change at some future time. Regardless of these conditions, application of the principles of this invention will assure that not less than fifty percent of the loading current will be available for measurement purposes. To permit the calculation of impedance from the measured voltage, either the current can also be measured, or it can be controlled at some convenient value, with the percentage of the current flowing through the measured string portion being known.

The foregoing description has assumed that each battery string has been divided into two equal portions and that two load control circuits are provided. It is understood that with appropriate changes to the switch 48, each battery string can be divided into more than two string portions and, further, that either one load control circuit can be provided for each set of string portions or that only a single load control circuit can be provided and selectively connected to the string portion being measured.

Accordingly, there has been disclosed an improvement in on-line battery impedance measurement. While an exemplary embodiment has been disclosed herein, it will be appreciated by those skilled in the art that various modifications and adaptations to the disclosed embodiment may be made and it is only intended that this invention be limited by the scope of the appended claims.

What is claimed is:

1. In combination with a battery system having at least one string of serially connected rechargeable battery cells and charging means connected across said at least one string for charging said battery cells, an arrangement for measuring the impedance of said battery cells without disconnecting said battery cells from said battery system, the arrangement comprising:
   means for providing connections across groups of said battery cells, each of said groups being within a respective single string and including at least one battery cell;
   load means for conducting electrical current;
   first switching means coupled between said load means and at least one predetermined point in each of said at least one string, said at least one predetermined point dividing said each string into at least two portions, there being at least one of said groups of cells within each of said portions within said each string;
   second switching means coupled to said connections;
   voltage measuring means coupled to said second switching means; and
   control means coupled to said first and second switching means for controlling said first switching means to couple said load means in succession across each portion of said each string and for controlling said second switching means to couple said voltage measuring means in succession across each of the groups of cells within the portion of said each string to which the load means is coupled at that time.

2. The arrangement according to claim 1 wherein said predetermined points divide said each string into a predetermined number of portions and said load means includes a plurality of loads, the number of loads being equal to said predetermined number and each of said loads being selectively coupleable across a respective portion of each of said at least one string by said first switching means.

3. The arrangement according to claim 2 wherein each of said loads is selectively switchable into a conducting state and a non-conducting state and said control means is coupled to said plurality of loads for selectively controlling the conductive states of said loads, said control means being operative so that only one load which is coupled across a respective portion of a string by said first switching means is in its conducting state.

4. The arrangement according to claim 2 wherein said predetermined number is two.

5. The arrangement according to claim 1 wherein said load means is selectively switchable into a conducting state and a non-conducting state and said control means is coupled to said load means for controlling the conductive state of said load means, said control means being operative to cause said load means to be in its conducting state when said load means is coupled across a portion of a string by said second switching means.

6. The arrangement according to claim 1 wherein said load means comprises means for controlling the current therethrough to a predetermined value.

7. In combination:
a first rail;
a second rail;
a plurality of battery cells connected as a plurality of parallel strings between said first and second rails, said strings each containing the same number of cells;
charging means for charging said battery cells, said charging means being coupled to said first and second rails;
first load means having first and second terminals for selectively conducting electrical current between its first and second terminals;
second load means having first and second terminals for selectively conducting electrical current between its first and second terminals;
means for connecting said first terminal of said first load means to said first rail, said second terminal of said first load means to said first terminal of said second load means, and said second terminal of said second load means to said second rail;
first means for providing connections to a respective intermediate point in each of said strings;
first switching means coupled to said first and second load means and said first connection providing means for selectively connecting the second terminal of said first load means and the first terminal of said second load means to the intermediate point in a selected one of said strings;
second means for providing connections across groups of said battery cells, each of said groups including at least one battery cell and all of the battery cells within each group being within a respective string;
voltage measuring means;
second switching means coupled to said voltage measuring means and said second connection providing means for selectively coupling said voltage measuring means across a selected group of battery cells; and
control means coupled to said first and second load means and said first and second switching means for
(a) controlling said first switching means to couple said first and second load means in succession to said intermediate points;
(b) controlling either said first load means or said second load means to be conductive; and
(c) controlling said second switching means to couple said voltage measuring means in succession across each group of battery cells within the string to which said first and second load means is connected and within that portion of the connected string across which one of said first and second load means is conductive.

8. A method for measuring the impedance of a plurality of rechargeable battery cells arranged in at least one string of serially connected battery cells to form a battery system including a charger coupled across said at least one string, the method being performed while the battery cells remain connected in the battery system and comprising the steps of:
providing load means for conducting electrical current;
providing voltage measuring means;
coupling the load means in succession across portions of said at least one string, with each portion having fewer than all of the battery cells within a string; and
coupling the voltage measuring means in succession across each of the battery cells within that string portion across which the load means is coupled.

* * * * *